(12) United States Patent
Zhang et al.

(10) Patent No.: US 11,592,493 B2
(45) Date of Patent: Feb. 28, 2023

(54) METHOD AND SYSTEM FOR BATTERY CAPACITY ESTIMATION USING VOLTAGE SLOPE CAPACITY AND DYNAMIC ANCHORS

(71) Applicant: GM GLOBAL TECHNOLOGY OPERATIONS LLC, Detroit, MI (US)

(72) Inventors: Alfred Zhang, Troy, MI (US); Justin Bunnell, Northville, MI (US); Garrett M. Seeman, Novi, MI (US); Jeffrey S. Piasecki, Rochester, MI (US); Charles W. Wampler, Birmingham, MI (US); Brian J. Koch, Berkley, MI (US); Jing Gao, Rochester, MI (US); Jeffrey A. Bednar, Highland, MI (US); Xiumei Guo, Troy, MI (US); Justin R. McDade, Livonia, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 453 days.

(21) Appl. No.: 16/743,848

(22) Filed: Jan. 15, 2020

(65) Prior Publication Data
US 2021/0215768 A1   Jul. 15, 2021

(51) Int. Cl.
| | |
|---|---|
| *G01R 31/30* | (2006.01) |
| *G01R 31/3832* | (2019.01) |
| *G01R 31/3842* | (2019.01) |
| *H01M 10/48* | (2006.01) |
| *H01M 10/42* | (2006.01) |
| *G01R 31/388* | (2019.01) |

(52) U.S. Cl.
CPC ....... *G01R 31/3833* (2019.01); *G01R 31/388* (2019.01); *G01R 31/3842* (2019.01); *H01M 10/425* (2013.01); *H01M 10/486* (2013.01); *H01M 2010/4271* (2013.01)

(58) Field of Classification Search
None
See application file for complete search history.

(56) References Cited

U.S. PATENT DOCUMENTS

| | | |
|---|---|---|
| 9,766,297 B2 | 9/2017 | Frost et al. |
| 10,288,692 B2 | 5/2019 | Laskowsky et al. |
| 2021/0033680 A1* | 2/2021 | Ukumori .............. G01R 31/382 |

* cited by examiner

*Primary Examiner* — Jas A Sanghera
(74) *Attorney, Agent, or Firm* — Quinn IP Law (57) ABSTRACT

A method for battery capacity estimation is provided. The method includes monitoring a sensor, collecting a plurality of data points including a voltage-based state of charge value and an integrated current value, defining within the data points a first data set collected during a first time period and a second data set collected during a second time period, determining an integrated current error related to the second data set, comparing the integrated current error related to the second data set to a threshold integrated current error. When the error related to the second data set exceeds the threshold, the method further includes resetting the second data set based upon an integrated current value from the first time period. The method further includes combining the data sets to create a combined data set and determining a voltage slope capacity estimate as a change in integrated current versus voltage-based state of charge.

19 Claims, 7 Drawing Sheets

METHOD AND SYSTEM FOR BATTERY CAPACITY ESTIMATION USING VOLTAGE SLOPE CAPACITY AND DYNAMIC ANCHORS

INTRODUCTION

The disclosure generally relates to a method and system for battery capacity estimation.

A battery is an electrochemical device that stores and delivers electrical energy to power devices. Batteries are employed on numerous devices, including hybrid or electric vehicles, cell phones, etc. Batteries are used to provide energy storage for a system. Batteries may be rechargeable. Battery capacity or battery charge capacity is a measure of how much charge is stored by the battery. As batteries are cyclically used to provide energy and are subsequently recharged, battery capacity may degrade.

SUMMARY

A method for battery capacity estimation is provided. The method includes, within a computerized battery capacity estimation controller, monitoring a sensor operable to gather data regarding a battery, collecting a plurality of data points based upon the data from the sensor, wherein each of the data points includes a voltage-based state of charge value and a corresponding integrated current value collected contemporaneously to the voltage-based state of charge value, within the plurality of data points, defining a first data set based upon the data from the sensor being collected during a first time period, within the plurality of data points, defining a second data set based upon the data from the sensor being collected during a second time period, determining an integrated current error related to the second data set, comparing the integrated current error related to the second data set to a threshold integrated current error, when the integrated current error related to the second data set exceeds the threshold integrated current error, resetting the second data set based upon one of the integrated current values from the first time period, combining the first data set and the second data set to create a combined data set, determining a slope of the combined data set as a change in the integrated current versus the voltage-based state of charge, defining the slope of the combined data set as a voltage slope capacity estimate, and managing the battery based upon the voltage slope capacity estimate.

In some embodiments, resetting the second data set includes determining a direct Coulomb counting error, determining an estimated Coulomb counting value through propagation of variances, comparing the direct Coulomb counting error to the estimated Coulomb counting value, and when the direct Coulomb counting error is greater than the estimate Coulomb counting value, utilizing a Coulomb counting anchor value to correct the second data set.

In some embodiments, resetting the second data set includes determining a direct Coulomb counting value for a selected data point from the data set two, estimating an integrated current value for a selected data point from data set one selected as an anchor point for the selected data point from data set two, determining a blended integrated current value based upon the direct Coulomb counting value and the estimated integrated current value, determining a direct Coulomb counting error variance value based upon the direct Coulomb counting value, determining an integrated current value variance value based upon the estimated integrated current value, determining a blended integrated current error variance value as a weighted average based upon the direct Coulomb counting error variance value and the integrated current value variance value, and correcting the second data set based upon the blended integrated current value and the blended integrated current error variance value.

In some embodiments, resetting the second data set includes determining a variance of integrated current error over increasing battery usage, determining a variance of voltage-based state of charge, comparing the variance of integrated current error over increasing battery usage to a value equal to two times the variance of voltage-based state of charge, and when the variance of integrated current error over increasing battery usage is greater than the value equal to two times the variance of voltage-based state of charge, resetting the variance of integrated current error over increasing battery usage to be equal to the variance of voltage-based state of charge.

In some embodiments, resetting the second data set includes comparing the voltage-based state of charge values for the second data set to the voltage-based state of charge values for the first data set, identifying one of the data points from the first data set an anchor point for the first data set and one of the data points from the second data set an anchor point for the second data set based upon a difference between the voltage-based state of charge value for the data point from the first data set and the voltage-based state of charge value for the data point from the second data set being less than a threshold, resetting the anchor point for the second data set based upon the anchor point for the first data set, and correcting the integrated current values of the second data set based upon the resetting of the anchor point for the second data set.

In some embodiments, resetting the anchor point for the second data set based upon the anchor point for the first data set includes setting the integrated current value for the anchor point for the second data set equal to the integrated current value for the anchor point for the first data set.

In some embodiments, resetting the anchor point for the second data set based upon the anchor point for the first data set includes referencing a historical value of the voltage slope capacity estimate and setting the integrated current value for the anchor point for the second data set based upon the integrated current value for the anchor point for the first data set and the historical value of the voltage slope capacity estimate.

In some embodiments, comparing the integrated current error related to the second data set to the threshold integrated current error includes determining an integrated current error variance value for the anchor point for the first data set, defining the integrated current error variance value for the anchor point for the first data set as a threshold variance value, and determining a difference between an integrated current error variance value for a first data point of the second data set and an integrated current error variance value of a second data point of the second data set. In some embodiments, the method further includes defining the integrated current error related to the second data set to exceed the threshold integrated current error when the difference is greater than the threshold variance value.

In some embodiments, the method further includes, within the computerized battery capacity estimation controller, determining the slope of the combined data set recursively by repeatedly collecting pluralities of the data points and resetting a portion of the data points.

In some embodiments, the method further includes, within the computerized battery capacity estimation controller, deleting one of the data points based upon the data point demonstrating a least influence on the slope of the combined data set.

In some embodiments, monitoring the sensor includes monitoring a sensor operable to measure battery usage over time, monitoring a sensor operable to measure battery current, monitoring a sensor operable to measure battery voltage, and monitoring a sensor operable to measure battery temperature.

In some embodiments, determining the slope of the combined data set includes applying a weighted total least squares process to the combined data set.

According to one alternative embodiment, a method for battery capacity estimation is provided. The method includes, within a computerized battery capacity estimation controller, monitoring a sensor operable to gather data regarding a battery, collecting a plurality of data points based upon the data from the sensor, wherein each of the data points includes a voltage-based state of charge value and a corresponding integrated current value collected contemporaneously to the voltage-based state of charge value, within the plurality of data points, defining a first data set based upon the data from the sensor being collected during a first time period, and, within the plurality of data points, defining a second data set based upon the data from the sensor being collected during a second time period. The method further includes determining an integrated current error related to the second data set and comparing the integrated current error related to the second data set to a threshold integrated current error. When the integrated current error related to the second data set exceeds the threshold integrated current error, the method includes resetting the second data set based upon one of the integrated current values from the first time period, the resetting including comparing the voltage-based state of charge values for the second data set to the voltage-based state of charge values for the first data set and identifying one of the data points from the first data set as an anchor point for the first data set and one of the data points from the second data set as an anchor point for the second data set based upon a difference between the voltage-based state of charge value for the data point from the first data set and the voltage-based state of charge value for the data point from the second data set being less than a threshold. The resetting further includes resetting the anchor point for the second data set based upon the anchor point for the first data set, wherein resetting the anchor point for the second data set based upon the anchor point for the first data set includes referencing a historical value of the voltage slope capacity estimate, and setting the integrated current value for the anchor point for the second data set based upon the integrated current value for the anchor point for the first data set and the historical value of the voltage slope capacity estimate, and correcting the integrated current values of the second data set based upon the resetting of the anchor point for the second data set. The method further includes combining the first data set and the second data set to create a combined data set, determining a slope of the combined data set as a change in integrated current versus voltage-based state of charge, defining the slope of the combined data set as a voltage slope capacity estimate, and managing the battery based upon the voltage slope capacity estimate.

In some embodiments, the method further includes, within the computerized battery capacity estimation controller, determining the slope of the combined data set recursively by repeatedly collecting pluralities of the data points and resetting a portion of the data points.

In some embodiments, the method further includes, within the computerized battery capacity estimation controller, deleting one of the data points based upon the data point demonstrating a least influence on the slope of the combined data set.

In some embodiments, monitoring the sensor includes monitoring a sensor operable to measure battery usage over time, monitoring a sensor operable to measure battery current, monitoring a sensor operable to measure battery voltage, and monitoring a sensor operable to measure battery temperature.

In some embodiments, determining the slope of the combined data set includes applying a weighted total least squares process to the combined data set.

According to one alternative embodiment, a system for battery capacity estimation is provided. The system includes a battery and a sensor operable to gather information regarding the battery. The system further includes a computerized battery capacity estimation controller programmed to monitor a sensor operable to gather data regarding a battery, collect a plurality of data points based upon the data from the sensor, wherein each of the data points includes a voltage-based state of charge value and a corresponding integrated current value collected contemporaneously to the voltage-based state of charge value, within the plurality of data points, define a first data set based upon the data from the sensor being collected during a first time period, within the plurality of data points, define a second data set based upon the data from the sensor being collected during a second time period, determine an integrated current error related to the second data set, compare the integrated current error related to the second data set to a threshold integrated current error, when the integrated current error related to the second data set exceeds the threshold integrated current error, reset the second data set based upon one of the integrated current values from the first time period, combine the first data set and the second data set to create a combined data set, determine a slope of the combined data set as a change in integrated current versus voltage-based state of charge, and define the slope of the combined data set as a voltage slope capacity estimate. The system further includes a computerized battery maintenance controller programmed to use the voltage slope capacity estimate to manage the battery.

In some embodiments, the system further includes a sensor operable to measure battery usage over time, a sensor operable to measure battery current, a sensor operable to measure battery voltage, and a sensor operable to measure battery temperature.

The above features and advantages and other features and advantages of the present disclosure are readily apparent from the following detailed description of the best modes for carrying out the disclosure when taken in connection with the accompanying drawings.

DETAILED DESCRIPTION

Battery capacity estimation methods in the art may produce noisy, inaccurate results. Further battery capacity estimation methods in the art may rely upon a single consistent anchor point to zero out amp hour error. This single consistent anchor point may be at a top of charge or fully charged condition for the battery. This top of charge single consistent anchor point may be difficult to achieve, for example, requiring a user to charge a battery for long periods without use to achieve a fully charged condition. As a result, a single consistent anchor point may be used for long periods of time, and this anchor point set at some distant point in the past may not accurately reflect operation of the battery which has degraded in capacity and operational properties since the anchor point was set. Further, error may be present when setting a single consistent anchor point. Making calculations based upon a single measurement in a complex system is inherently problematic and may propagate errors through the resulting calculations. This method using a single consistent anchor may be described as a voltage slope capacity method.

An improved voltage slope capacity method for measuring or estimating battery capacity is provided using rested voltage lookups and integrated current (amp hours) to derive a regressed slope plot useful to provide the estimated battery capacity for dynamic operating points. The method may include utilizing blended data sets by tracking variance in each of amp hours, voltage, and battery capacity values. By using the blended data sets, the need to use single consistent anchor points set at top of charge is obviated.

Figure 1:
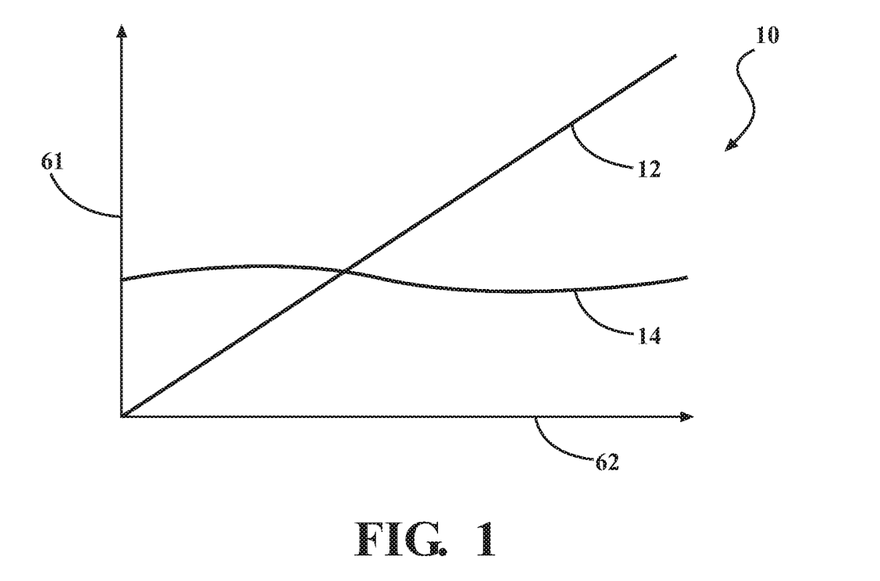
FIG. 1 graphically illustrates variance versus time/amp hour throughput for amp hours and voltage-based state of charge for a battery without an ability to reset Coulomb counting errors, in accordance with the present disclosure.

The provided method may include resetting a Coulomb counting error without requiring a single consistent anchor point. Without a way to reset Coulomb counting errors, integrated current error may grow over battery usage. Referring now to the drawings, wherein like reference numbers refer to like features throughout the several views, FIG. 1 graphically illustrates variance versus time/amp hour throughput for amp hours and voltage-based state of charge for a battery without an ability to reset Coulomb counting errors. Graph 10 is illustrated including a vertical axis 61 based upon variance of plotted terms and a horizontal axis 62 based upon battery usage (either time or amp hour throughput). Plot 12 is illustrated showing variance of integrated current error over increasing battery usage. Plot 12 may be described as a direct Coulomb counting error. Plot 12, describing variance of integrated current error over increasing battery usage or the direct Coulomb counting error, may be characterized by the following equation:

$$\sigma_{Ah}^2 = \sum \sigma_I^2(I, T) \cdot \frac{\Delta t}{\omega} \quad [1]$$

where $\sigma_{Ah}^2$ represents the direct coulomb counting error, $\sigma_I^2(I, T)$ represents the variance of current sensor error as a function of current I and temperature T, $\Delta t$ represents the time interval between samples, and co represents the sampling frequency. Plot 12 shows variance of integrated current error increasing over battery usage. Plot 14 is illustrated showing variance of voltage-based state of charge over increasing battery usage. Plot 14 may be characterized by the following equation:

$$\sigma_V^2 = \sigma_V^2(SOC, T) \quad [2]$$

where $\sigma_V^2$ represents the variance of the voltage-based state of charge (a function of state of charge SOC and temperature T). Plot 14 shows variance of voltage-based state of charge remaining steady over battery usage. In other words, while integrated current error increases over battery usage, voltage measurement does not accumulate error over battery usage.

Figure 2:
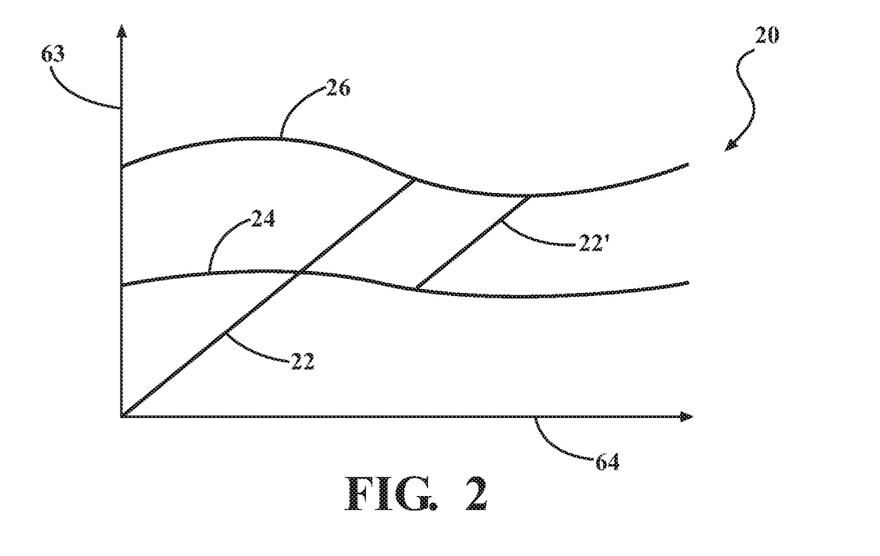
FIG. 2 graphically illustrates variance versus time/amp hour throughput for amp hours and voltage-based state of charge for a battery, including a diagnostic comparison useful to make a decision to anchor data to reset integrated current error, in accordance with the present disclosure.

FIG. 2 graphically illustrates variance versus time/amp hour throughput for amp hours and voltage-based state of charge for a battery, including a diagnostic comparison useful to make a decision to anchor data to reset integrated current error. Graph 20 is illustrated including a vertical axis 63 based upon variance of plotted terms and a horizontal axis 64 based upon battery usage (either time or amp hour throughput). Plot 22 is illustrated showing variance of integrated current error over increasing battery usage. Plot 24 is illustrated showing variance of voltage-based state of charge over increasing battery usage. Plot 26 is illustrated showing two times the variance of voltage-based state of charge over increasing battery usage. Plot 24 results in a horizontal wavy line extending across graph 20 at a constant vertical axis value, and plot 26 results in a horizontal wavy line extending across graph 20 at a vertical axis value some multiple value times the vertical axis value of plot 24. In the exemplary embodiment of FIG. 2, the selected multiple value is two. Plot 22 increases in vertical axis value over battery usage until the value of plot 22 reaches the vertical axis value of plot 26. At this point, the variance or vertical axis value of plot 22 may be anchored or reset to the vertical axis value of plot 24, with a remainder of values of variance when integrated current error to a right of the reset being labeled plot 22'. Comparing the variance of the integrated current error to the variance of voltage-based state of charge may be used to decide when anchoring is appropriate or useful. When the variance of the integrated current error is small, anchoring is unnecessary. When variance of the integrated current error increases to a threshold, anchoring is appropriate. In this way, the variance of integrated current error over increasing battery usage may be reset or reduced to improve estimate values. The multiple value used to set the vertical axis value of plot 26 may be selected from various potential numbers. A small multiple value, such as one, may be used and will result in values being anchored frequently. A larger multiple value, such as three or four, may be used and will result in values being anchored less frequently.

Figure 3:
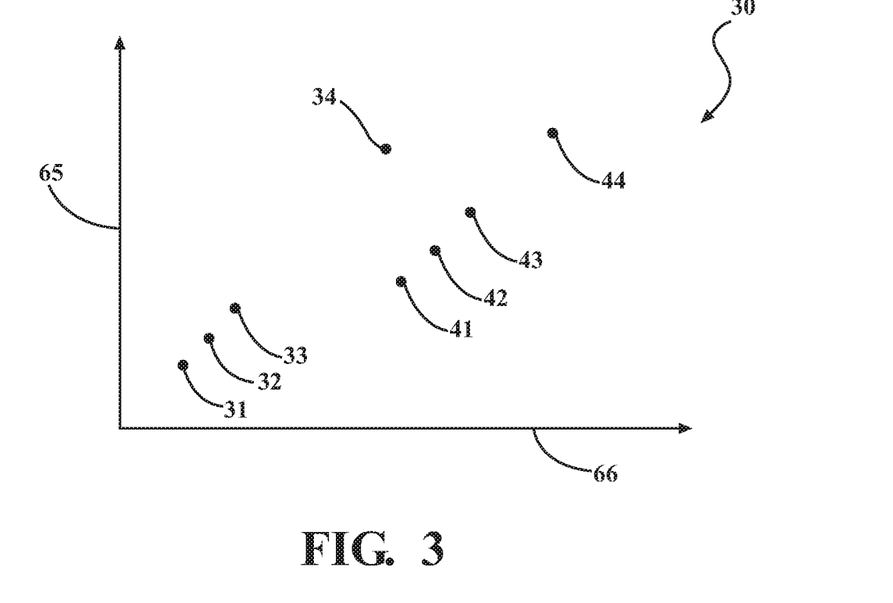
FIG. 3 graphically illustrates voltage-based state of charge versus a change in amp hours, wherein two distinct data sets are plotted upon the graph, with no anchoring or resetting of integrated current error, in accordance with the present disclosure.

FIG. 3 graphically illustrates voltage-based state of charge versus a change in amp hours, wherein two distinct data sets are plotted upon the graph, with no anchoring or resetting of integrated current error. Graph 30 is illustrated including a vertical axis 65 based upon a rested voltage-based state of charge and a horizontal axis 66 based upon a change in integrated current (Δ amp hours.) Data set one is illustrated to include data point 31, data point 32, data point 33, and data point 34. Data set two is illustrated to include data point 41, data point 42, data point 43, and data point 44. Data set two is taken significantly later in time than data set one, and, as a result, includes significantly larger integrated current error. Deriving useful information from the combination of data set one and data set two, in particular developing a slope between data points, is difficult due to the effects of the ever-increasing integrated current error.

FIG. 2 provides a diagnostic comparison useful to make a decision to anchor data to reset integrated current error. Once the decision to anchor is made, a method to reset or adjust data points on FIG. 3 to adjust for accumulated integrated current error may include selecting a point from data set one and a point from data set two to reset the integrated current value of the point from data set two based upon the integrated current value from the point from data set one. These two selected points may be labeled anchor points. The two selected points may be selected based upon a difference between their voltage-based state of charge values being relatively small.

Figure 4:
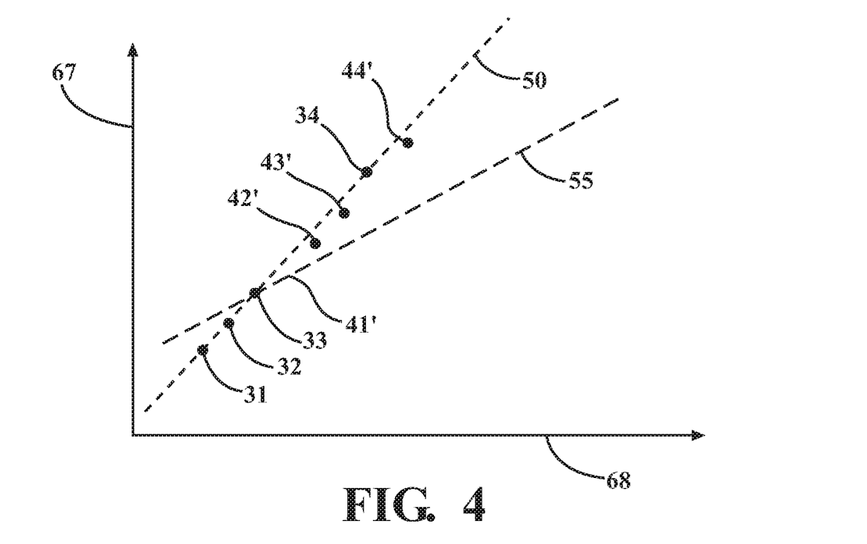
FIG. 4 graphically illustrates voltage-based state of charge versus a change in amp hours, wherein the two distinct data sets of FIG. 3 are reset accounting for Coulomb counting error, in accordance with the present disclosure.

FIG. 4 graphically illustrates voltage-based state of charge versus a change in amp hours, wherein the two distinct data sets of FIG. 3 are reset accounting for Coulomb counting error. Graph 40 is illustrated including a vertical axis 67 based upon a rested voltage-based state of charge and a horizontal axis 68 based upon battery current discharge (Δ amp hours.) Data set one including data point 31, data point 32, data point 33, and data point 34 and data set two including data point 41', data point 42', data point 43', and data point 44' are illustrated. Data set one is the same as data set one of FIG. 3. Data set two includes values similar to data set two of FIG. 3, with the exception that the values include a reset integrated current error. In the embodiment of FIG. 3, data point 33 and data point 41 include close voltage-based state of charge values and may be selected as anchor points. Returning to FIG. 4, slope 55 includes a previous estimate of a voltage slope capacity, for example, based upon original manufacturing specifications for the battery or a previous calculation made by the provided method. Data point 41 from FIG. 3 may be reset adjusted with a corrected integrated current value based upon placing the point upon slope 55 on FIG. 4, maintaining the voltage-based state of charge value for data point 41 from FIG. 3. As a result, data point 41' is at a same vertical position on FIG. 4 as data point 41 on FIG. 3, but the horizontal position of data point 41' is adjusted on FIG. 4 with respect to the horizontal position of data point 41 of FIG. 3. In this way, data point 41' has been anchored to data point 33 based upon a previous voltage slope capacity. Data point 42', data point 43' and data point 44' are similarly adjusted to data point 41', with a same integrated current value correction being applied to each of data point 42', data point 43', and data point 44'. Slope 50 may then be fit to data point 31, data point 32, data point 33, data point 34, data point 41', data point 42', data point 43', and data point 44'.

The method of FIG. 4 may be recursively operated, dynamically defining data set one and data set two using multiple anchors. In one example, data points including pairs of values (i.e., a voltage-based state of charge and a corresponding integrated current value) may be examined chronologically one at a time, comparing each data point starting at the second collected in time to an earlier collected data point and then proceeding to later collected data points. In one example, a second data point collected may be compared to a first data point collected, then a third data point collected may be compared first to the first data point collected and then to the second data point collected. Subsequently a fourth data point may be compared to the first data point collected, then to the second data point collected, and then to the third data point collected. This method may continue until every data point is examined against every other earlier collected data point. When anchoring is justified by a comparison, that data point and every later collected data point may have their respective integrated current value reset based upon the selected anchor point. A single data point may have its respective integrated current value reset more than once, for example, with reset values being initiated as earlier collected data points are compared to anchor points, and then later being reset again as the single data point is later reset based upon an anchor point. The first data set and the second data set may adjust through iterative analyses, for example, with relatively earlier collected data points initially in the second data set being moved to the first data set as they are compared to relatively later collected data points in the second data set.

According to one embodiment, these iterative analyses may be expressed by the following equations. Indexing current measurements from time 0 to time N, the variance in the integrated current error (assuming zero bias in the measurement and independent errors between samples) may be expressed as follows:

$$(\sigma_{Ah}^2)_N = (\sigma_{Ah}^2)_0 + \Sigma_{k=1}^{N} \sigma_I^2(I_k, T_k) \cdot \Delta t_k^2 \approx (\sigma_{Ah}^2)_0 + \sigma_I^2 \cdot \Delta t \cdot t_N \quad [3]$$

where $(\sigma_{Ah}^2)_0$ is the initial variance in the integrated current error, $\sigma_I^2(I_k, T_k)$ is the variance in the error of the current sensor as a function of current and temperature, $\Delta t_k$ is the time elapsed since the previous sample, and the sum is taken over all samples from the initial time to the present. The approximation holds when the variance in the current measurement is a constant value $\sigma_I^2$, and the time between samples is a constant value $\Delta t$, hence $t_N = N\Delta t$ is the total elapsed time. Accordingly, one may see that the integrated current error variance grows monotonically and is approximately linearly with time.

The variance in state of charge obtained from reverse lookup from a rested voltage at time N can be approximated as follows:

$$\sigma_{SOC,N}^2 = \sigma_V^2(T_N, t_{rested,N}, V_N) \cdot \left(\frac{dSOC}{dU}(V_N)\right)^2 \quad [4]$$

where $\sigma_{SOC,N}^2$ represents the variance in state of charge obtained by reverse lookup from a rested voltage at time N, $\sigma_V^2(T_N, t_{rested,N}, V_N)$ represents the variance in voltage error as a function of temperature $T_N$, rested voltage $V_N$, and time since battery has been resting $t_{rested,N}$, and $$\frac{dSOC}{dU}(V_N)$$

represents the slope of the thermodynamic curve relation state of charge, SOC, to open-circuit voltage, U, as a function of the rested voltage at time N ($V_N$). Accordingly, while $\sigma_{SOC,N}^2$ may vary with the slope of the open-circuit voltage curve, and the conditions at which the measurement was made, it may not grow with each measurement.

As a result of the anchoring method illustrated in FIG. 4, whereas in FIG. 3, data set one and data set two were virtually incompatible due to accumulated integrated current error between times when the data sets were collected, data set one and data set two of FIG. 4 are compatible such that the data sets can be blended, and a slope 50 may be derived reflecting a battery capacity estimate based upon the blended data of data set one and data set two.

Figure 5:
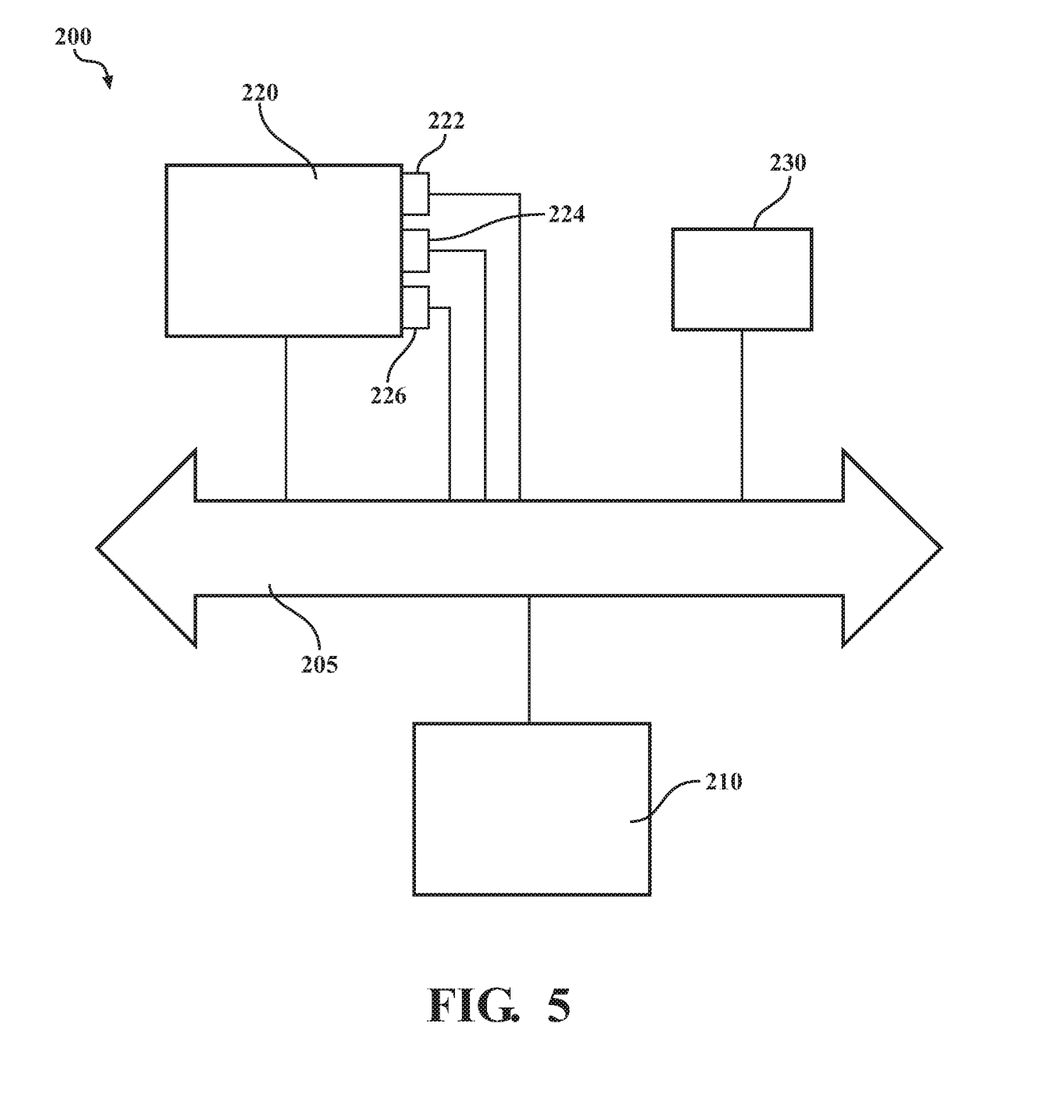
FIG. 5 schematically illustrates a system communication architecture operable to transmit data between devices, sensors, controllers and other electronic devices in the system, in accordance with the present disclosure.

FIG. 5 schematically illustrates a system communication architecture 200 operable to transmit data between devices, sensors, controllers and other electronic devices in the system. System communication architecture 200 includes communications bus 205 configured to provide an ability for devices, sensors, controllers and other electronic devices in the system to electronically communicate. The components of system communication architecture 200 may be described as a system for battery capacity estimation.

Computerized battery capacity estimation controller 210 is illustrated communicably connected to communications bus 205. Battery capacity estimation controller 210 is a computerized device including a computerized processor, random access memory, and a durable memory storage device and is operable to execute programming. Battery capacity estimation controller 210 may be programmed to operate the method 300 of FIG. 6 or a similar method.

Battery system 220 is illustrated communicably connected to communications bus 205. One battery or a plurality of batteries may be present and connected to the communications bus 205. Battery system 220 includes a device operable to store, receive, and selectively provide electrical energy. The battery system 220 may be a lithium-polymer device or another rechargeable electrochemical configuration that is arranged to supply electric power, may include a single battery cell or multiple linked battery cells, and may supply direct current electrical power. Battery system 220 may include electronic circuitry operable to provide and receive data through communications bus 205. A battery temperature sensor 222, a battery voltage sensor 224, and a battery current sensor 226 are illustrated connected to the battery system 220. Each of the battery temperature sensor 222, battery voltage sensor 224, and the battery current sensor 226 may be communicably connected to the communications bus 205, for example, providing data to the battery capacity estimation controller 210 through the communications bus 205. A separate battery time sensor may additionally be provided, for example, connected to battery system 220 and in communication with communication bus 205. In the embodiment of FIG. 5, a time sensor is built into battery current sensor 226 for purposes of integrating or accumulating total current discharge for the battery system 220 over a time period.

The capacity maintenance controller 230 is illustrated communicably connected to communication bus 205. The capacity maintenance controller 230 is a computerized device including a computerized processor, random access memory, and a durable memory storage device and is operable to execute programming. Capacity maintenance controller 230 may be programmed to operate processes related to operating and managing the battery system 220 and the associated electrical system. The capacity maintenance controller 230 may include programming useful to manage charging and discharging cycles with increase efficiency in light of the provided battery capacity estimations; to provide timely and more accurate alerts to a user or owner of the battery to estimate when maintenance and/or replacement of the battery is required; and to provide improved range estimates or remaining charge estimates for the battery to enable an increased ability to rely upon the battery for a particular duration. Additionally, the capacity maintenance controller may adjust charge and discharge voltage and current limits, such that the battery is protected from excessive wear and tear. This reduces warranty costs and provides a more consistent drive experience for the customer.

Figure 6:
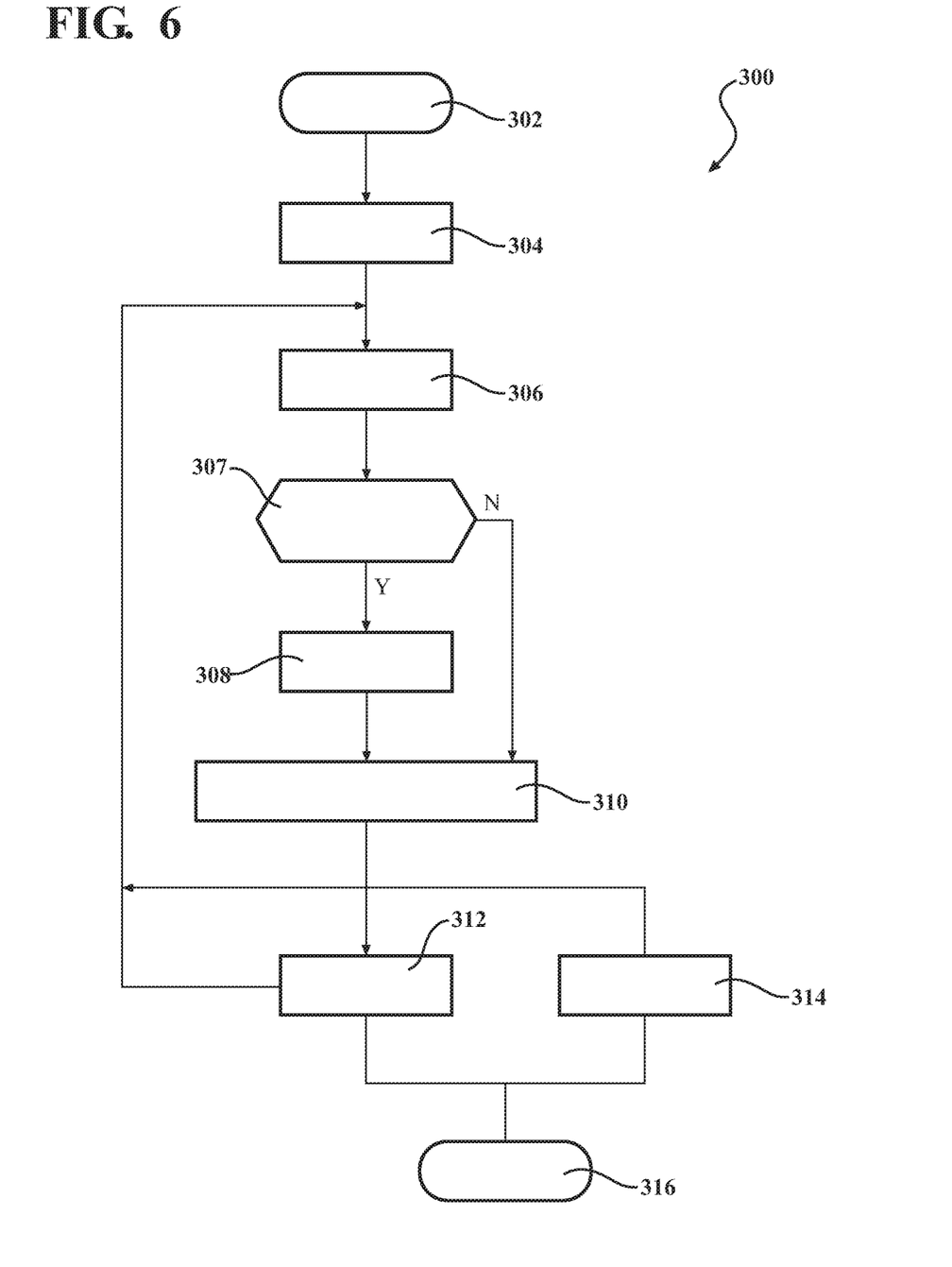
FIG. 6 is a flowchart illustrating an exemplary method to estimate battery capacity, in accordance with the present disclosure.

FIG. 6 is a flowchart illustrating an exemplary method 300 to estimate battery capacity. Method 300 starts at step 302. At step 304, sensors related to operation and state of the battery are monitored and data is collected. These sensors may include a time sensor, for example, measuring time through which a battery is providing electrical power and/or the passage of time through a time period; a current sensor measuring current draw of the system providing electrical power by the battery; a voltage sensor measuring voltage of the battery, for example, both while the battery is at rest and while it is supplying electrical power; and a temperature sensor. At step 306, the data collected in step 304 is processed, for example, to determine a Coulomb count, a Coulomb counting error estimate, a voltage-based state of charge, and a voltage-based state of charge error estimate. At step 307, data points comparing voltage-based state of charge to integrated current values resulting from the processed values of step 306 are analyzed. A determination is made whether an integrated current error has increased such that an adjustment to integrated current values or anchoring is justified. This adjustment, correcting for accumulated integrated current error, may be accomplished in step 308 by adjusting integrated current values to correspond with earlier more accurate integrated current values. This adjustment method may be described as anchoring the resulting data values used for the voltage slope capacity estimation. If the integrated current error has increased in excess of a threshold, then the integrated current values are anchored and reset in step 308 per the provided method, and data points including the adjusted data points are provided to step 310. If the integrated current error has not increased in excess of the threshold, data points created based upon data from step 306 are provided to step 310. At step 310, data points from step 308 are utilized to fit a slope to the data points, and the slope is utilized to determine a new voltage slope capacity estimation for the battery. This voltage slope capacity estimation is provided to a battery state estimation method at step 312, to a capacity maintenance module at step 314, and is returned to step 306 for subsequent iterations of voltage slope capacity estimations. Method 300 may repeat recursively, with subsequent estimations anchoring data points and resetting integrated current values as appropriate. Method 300 ends at step 316. Method 300 is exemplary, a number of alternative embodiments of method 300 are envisioned, and the disclosure is not intended to be limited to the example provided herein.

Figure 7:
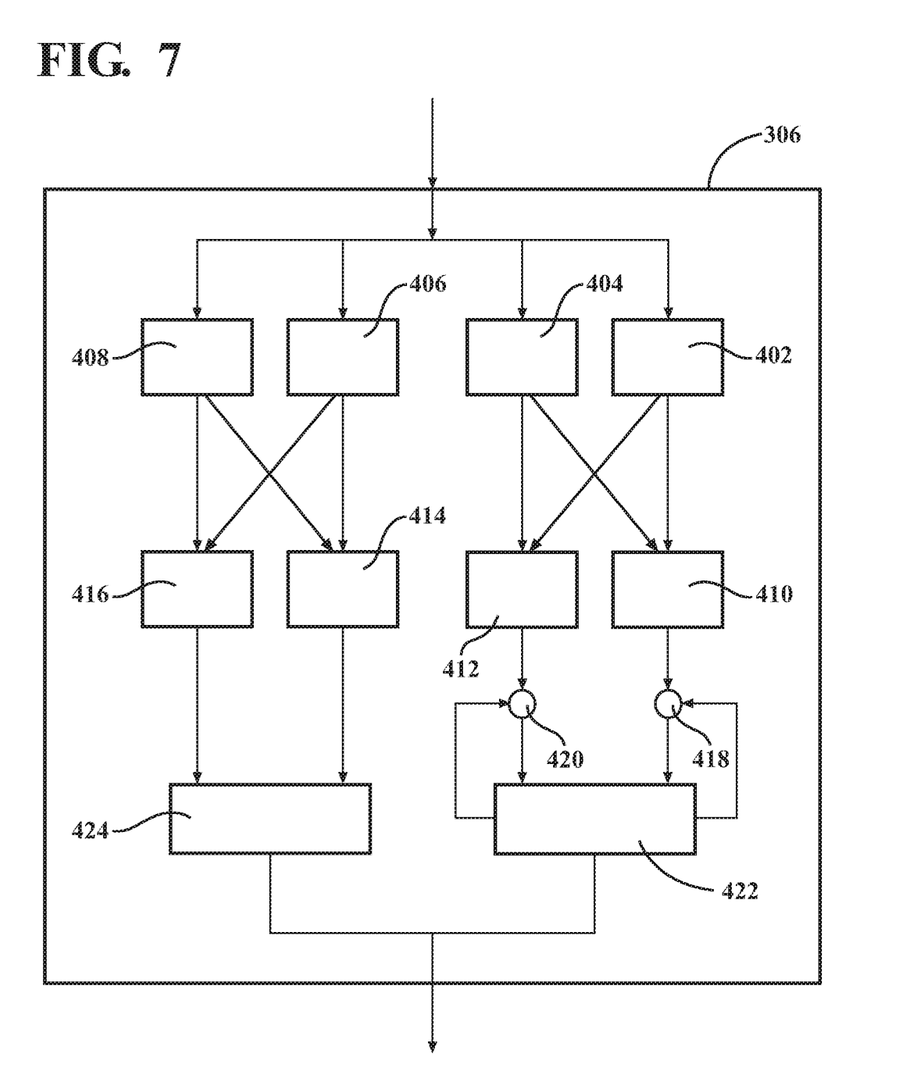
FIG. 7 is a flowchart illustrating an exemplary embodiment of step 306 from FIG. 6, processing sensor data to provide integrated current values and voltage-based state of charge values related to operation of the battery being monitored, in accordance with the present disclosure.

FIG. 7 is a flowchart illustrating an exemplary embodiment of step 306 from FIG. 6, processing sensor data to provide integrated current values and voltage-based state of charge values related to operation of the battery being monitored. Step 306 includes sub-step 402, wherein data from a time sensor is monitored; sub-step 404, wherein data from a current sensor is monitored; sub-step 406, wherein data from a voltage sensor is monitored; and sub-step 408, wherein data from a temperature sensor is monitored. Data from sub-step 402 and sub-step 404 is provided to sub-step 412, wherein a Coulomb count for the battery is determined. Data from sub-step 402 and sub-step 404 is additionally provided to sub-step 410, wherein a Coulomb counting error for the battery is determined. Data from sub-step 406 and sub-step 408 is provided to sub-step 416, wherein a voltage-based state of charge for the battery is determined. Data from sub-step 406 and sub-step 408 is additionally provided to sub-step 414, wherein a voltage-based state of charge error is estimated for the battery. The Coulomb count from sub-step 412 is provided to summation block 420, where the Coulomb count is adjusted based upon a previous Coulomb count value, and an updated Coulomb count value is provided to sub-step 422. The Coulomb counting error from sub-step 410 is provided to summation block 418, where the Coulomb counting error is adjusted based upon a previous Coulomb counting error value, and an updated Coulomb counting error value is provided to step sub-422. The voltage-based state of charge from step sub-416 is provided to sub-step 424. The voltage-based state of charge error from sub-step 414 is provided to sub-step 424. At sub-step 422, integrated current values and integrated current error values are stored in chronological order, provided as feedback, and provided as an output to step 308 of FIG. 6. At sub-step 424, voltage-based state of charge and voltage-based state of charge error are stored chronologically and provided as an output to step 308 of FIG. 6.

Figure 8:
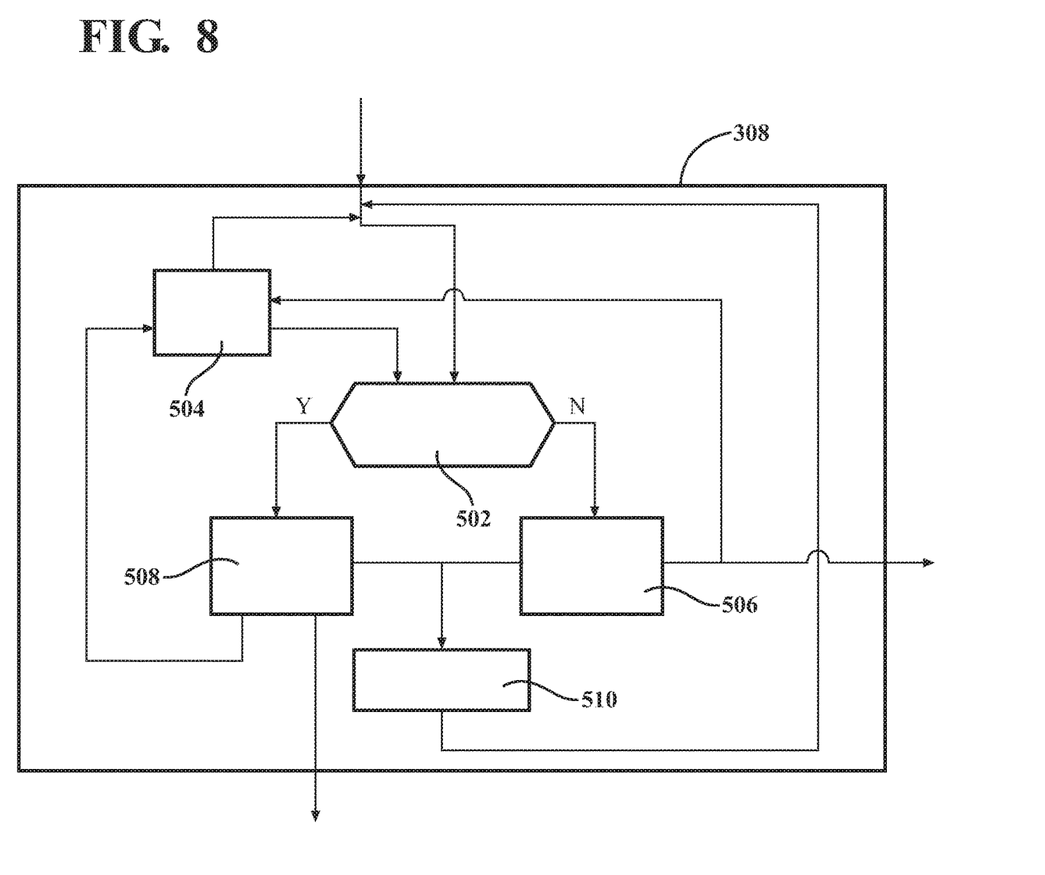
FIG. 8 is a flowchart illustrating an exemplary embodiment of step 308 of FIG. 6, wherein a determination is made whether an integrated current error is greater than a threshold integrated current error, in accordance with the present disclosure.

FIG. 8 is a flowchart illustrating an exemplary embodiment of step 308 of FIG. 6, wherein integrated current values may be anchored and reset. At sub-step 504, values from step 306 are provided as inputs. An integrated current error variance value of an anchor point is determined based upon the inputs. The anchor point includes historical data from an earlier collected data point which is to be compared to a more recently collected data point to determine whether the more recently collected data point should be reset based upon the anchor point. One exemplary determination of such an integrated current error variance value is described through Equation 10, herein below. This integrated current error variance value of the anchor point is provided to sub-step 502, wherein the value from sub-step 504 is compared as a threshold value to an integrated current error variance value of the more recently collected data point. If the integrated current error variance value of the more recently collected data point exceeds the threshold set by the value from sub-step 504, then the method advances to sub-step 508. If the integrated current error variance value of the more recently collected data point does not exceed the threshold set by the value from sub-step 504, then the method advances to sub-step 506.

At sub-step 508, an integrated current value associated with the most recently collected data point is replaced based upon the integrated current value for the anchor point. Similarly, adjustments are made to integrated current values related to data points collected within a recent time span. The adjusted data points are provided as outputs to be used in step 310 of FIG. 6. The method then advances to sub-step 510.

At sub-step 506, no adjustment is made to the data points. The data points are provided as outputs to be used in step 310 of FIG. 6. The method then advances to sub-step 510.

At sub-step 510, the method is repeated for each successive data point until all data points are compared and anchored as appropriate.

Figure 9:
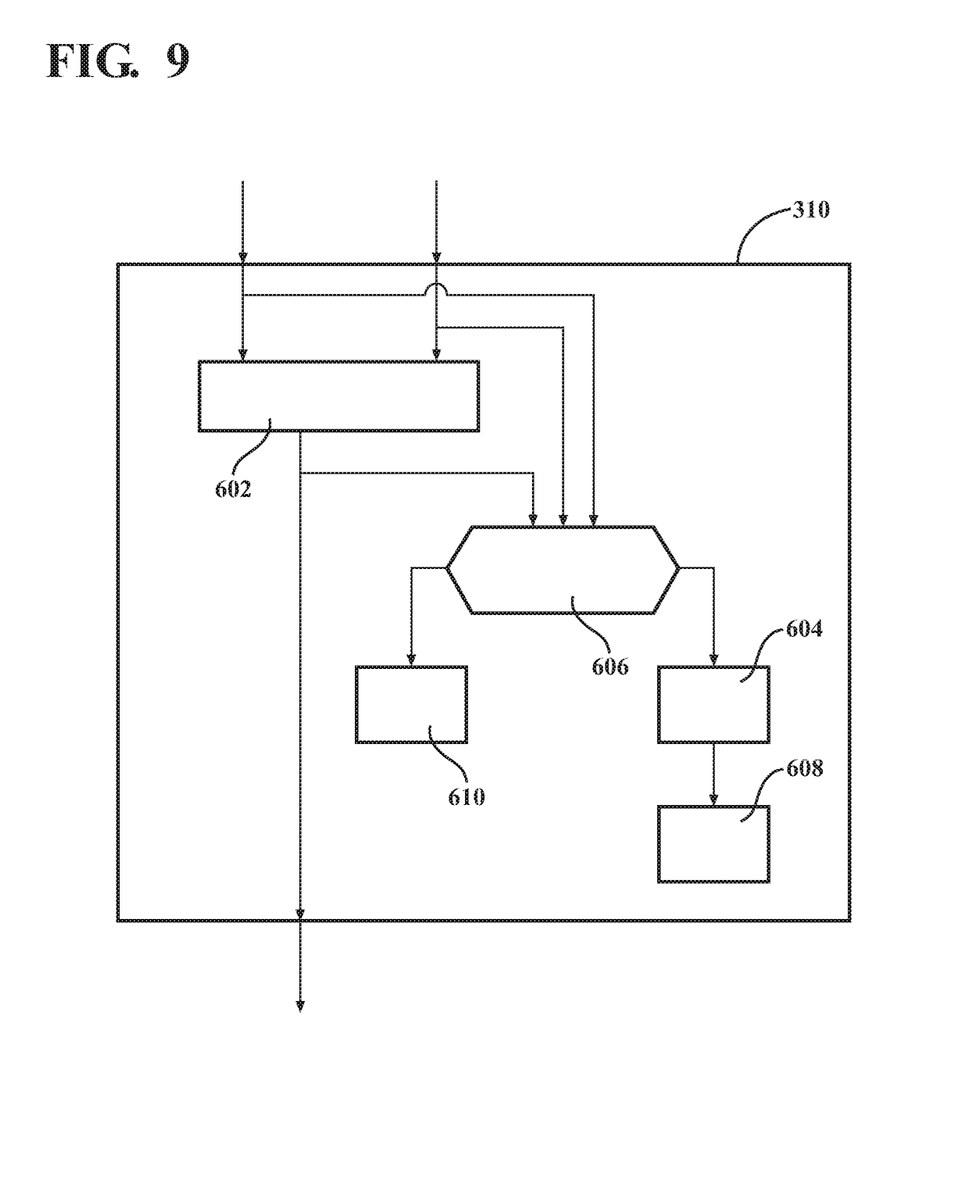
FIG. 9 is a flowchart illustrating an exemplary embodiment of step 310 of FIG. 6, wherein a voltage slope capacity estimation is made and additionally a determination is made whether to save or delete collected data points, in accordance with the present disclosure.

FIG. 9 is a flowchart illustrating an exemplary embodiment of step 310 of FIG. 6, wherein a voltage slope capacity estimation is made and additionally a determination is made whether to save or delete collected data points. At sub-step 602, values from step 308 are provided as inputs. A slope is fit to data points, as is illustrated in the determination of slope 50 of FIG. 4, and the voltage slope capacity estimation is provided as an output to steps 312, 314, and 306 of FIG. 6. In one embodiment, the voltage slope capacity estimation is determined through a weighted total least squares process. Additionally, inputs from step 308 and the output of sub-step 602 are provided to sub-step 606.

At sub-step 606, a determination is made as to whether a data storage device is full. If the data storage device is full, the method advances to sub-step 604, wherein a determination is made which data point is least influential to the voltage slope capacity estimate. The data point which is least influential is deleted at sub-step 608 and the latest data point is saved.

If the data storage device is determined at sub-step 606 not to be full, the latest data point is saved at step 610.

Calculations may be used to derive or make use of data generated through the provided method. Voltage measurements may be converted to state of charge (SOC). The state of charge at time N (SOC$_N$) may be determined from a rested voltage (V$_N$) using the inverse of the thermodynamic relationship between the state of charge and open-circuit voltage (U$^{-}$) as follows:

$$SOC_N = U^{-1}(V_N) \quad [5]$$

$U^{-1}(V_N)$ represents the relationship between the state of charge and an equilibrium open circuit voltage. The state of charge at time N (SOC$_N$) may be determined from a rested voltage (V$_N$) using the inverse of the thermodynamic relationship between the state of charge and open-circuit voltage (U$^{-1}$) as follows:

$$\text{Capacity} = \frac{\Delta Ah}{\Delta SOC} \quad [6]$$

wherein $\Delta Ah$ represents the change, or difference in integrated current value, and $\Delta SOC$ represents the corresponding change, or difference in state of charge. Thus, capacity is the slope of a line of a plot where the horizontal axis plots state of charge and the vertical axis plots the integrated current (Ah) value. This slope is calculated using multiple data points, each including voltage data and amp hour data, using a weighted least squares regression. Indexing data points from 1 to N, the capacity may be determined using the slope of a weighted least squares line as follows:

$$\text{Capacity} = \frac{\left(\sum_{i=1}^{N} w_i\right) \cdot \left(\sum_{i=1}^{N} w_i x_i y_i\right) - \left(\sum_{i=1}^{N} w_i x_i\right) \cdot \left(\sum_{i=1}^{N} w_i y_i\right)}{\left(\sum_{i=1}^{N} w_i\right) \cdot \left(\sum_{i=1}^{N} w_i x_i^2\right) - \left(\sum_{i=1}^{N} w_i x_i\right)^2} \quad [7]$$

wherein $\Sigma_{i=1}^{N}$ represents the sum over all of the data points, $w_i$ represents the weight of the i$^{th}$ data point, $x_i$ represents the i$^{th}$ x value (state of charge in this case), and $y_i$ represents the $i^{th}$ y value (integrated current value in this case). Values for w may be derived from accuracy analysis.

Variance of amp hour data, $\sigma_{Ah}^2$, may be modeled using current sensor error from specification data sheets and a random walk, for example, as described in Equation 3 herein above. Variance of calculated state of charge $\sigma_{SOCV}^2$ may be modeled using voltage sensor error, hysteresis error, and error due to insufficient rest time, for example, as described in Equation 5 above. The following describes variance of error terms that contribute to overall voltage error in equation 3:

$$\sigma_V^2(T_N,t_{rested,N},V_N) \approx \sigma_{Vsensor}^2(T_N) + \sigma_{Vrest}^2(t_{rested,N}) + \sigma_{hyst}^2(V_N) \qquad [8]$$

wherein, $\sigma_V^2(T_N,t_{rested,N},V_N)$ represents the total voltage error variance in the rested voltage value, $\sigma_{Vsensor}^2$ represents the variance of voltage sensor error as a function of temperature $T_N$, $\sigma_{Vrest}^2(t_{rested,N})$ is the variance due to the battery not being at true equilibrium as a function of time that the battery had been resting $t_{rested,N}$, and $\sigma_{hyst}^2(V_N)$ represents variance due to voltage hysteresis, a history-dependent effect: the rested voltage may be dependent on whether the battery had last been charging or discharging.

Weights for linear regression may be calculated using the errors from measurements as follows:

$$w_i = \frac{1}{Cap_{est}^2 \sigma_{xi}^2 + \sigma_{yi}^2} \qquad [9]$$

The weight for the $i^{th}$ data point is determined by the following values: $CaP_{est}$, a previous capacity estimate, or a calculated capacity based upon a capacity, model; $\sigma_{xi}^2$, the variance associated with the x value of the $i^{th}$ data point (variance of state of charge in the case of capacity estimation); and $\sigma_{yi}^2$, the variance associated with the y value of the $i^{th}$ data point (variance of integrated current value in the case of capacity estimation).

Given two data points, the first corresponding to time index i, and the second corresponding to time index j, the difference in integrated current value $\Delta Ah = Ah_j - Ah_i$ may be estimated using a previous capacity estimate $Cap_{est}$ and the difference in state of charge value $\Delta SOC = SOC_j - SOC_i$ as follows:

$$\Delta Ah_{anchor} \approx Cap_{est} \cdot \Delta SOC$$

wherein $\Delta Ah_{anchor}$ represents the estimate (as opposed to the direct Coulomb counting value $\Delta Ah = Ah_j - Ah_i$).

Error of this estimated value $\Delta Ah_{anchor}$ may be calculated using propagation of variances as follows:

$$\sigma_{Ah\,anchor}^2 = \sigma_{CapEst}^2 \sigma_{\Delta SOCV}^2 + CAP_{est}^2 \sigma_{\Delta SOCV}^2 + \Delta SOC_V^2 \sigma_{CapEst}^2 \qquad [11]$$

$\sigma_{CapEst}^2$ represents the variance in the previous capacity estimate $Cap_{est}$, and $\sigma_{\Delta SOC}^2$ represents the variance associated with the difference in state of charge value $\Delta SOC$ The resulting error may be compared to the direct Coulomb counting error. If $\sigma_{Ah}^2$ is greater than $\sigma_{Ah\,anchor}^2$, then replace $\Delta Ah$ from Coulomb counting with $\Delta Ah_{anchor}$. If $\sigma_{Ah}^2$ is not greater than $\sigma_{Ah\,anchor}^2$, then no replacement is made. In the alternative, the $\Delta Ah$ value and the $\Delta Ah_{anchor}$ may be balanced using a weighted average as follows:

$$\Delta Ah_{blend} = w_1 \Delta Ah + w_2 \Delta Ah_{anchor}$$

where:

$$w_1 = \frac{\sigma_{Ah\,anchor}^2}{\sigma_{Ah\,anchor}^2 + \sigma_{Ah}^2} \qquad [13]$$

$$w_2 = \frac{\sigma_{Ah}^2}{\sigma_{Ah\,anchor}^2 + \sigma_{Ah}^2} \qquad [14]$$

The error variance associated with the weighted average of the direct Coulomb counting $\Delta Ah$ and the estimated $\Delta Ah_{anchor}$ may be expressed as follows:

$$\sigma_{Ah\,blend}^2 = \frac{\sigma_{Ah\,anchor}^2 \sigma_{Ah}^2}{\sigma_{Ah\,anchor}^2 + \sigma_{Ah}^2} \leq \min(\sigma_{Ah}^2, \sigma_{Ah\,anchor}^2) \qquad [15]$$

$\sigma_{Ah,blend}^2$ represents the error variance associated with the weighted average, $\sigma_{Ahanchor}^2$ represents the variance associated with the estimated Coulomb counting value $\Delta Ah_{anchor}$, and $\sigma_{Ah}^2$ represents the variance associated with the direct Coulomb counting value $\Delta Ah$. Mathematically, $\sigma_{Ah,blend}^2$ is always less than or equal to the minimum between $\Delta Ah$ and $\Delta Ah_{blend}$.

The afore described equations include one exemplary embodiment to accomplish the provided method. A number or alternatives are envisioned, and the disclosure is not intended to be limited to the particular examples provided herein.

Additionally, a method may utilize an open circuit voltage versus state of charge characterization curve to calculate the state of charge of individual battery cell groups within a battery system.

Additionally, a method may utilize amp hour integration or Coulomb counting to determine the total amount of charge that has passed through the cell groups in a battery system.

Additionally, a method may utilize current sensor error and a stochastic model (random walk or other) to model uncertainty in state of charge calculations.

Additionally, a method may utilize voltage sensor error, rest times, a hysteresis model, and a state estimator (Kalman filter or similar computational tool) to model uncertainty in state of charge calculations.

Additionally, a method may utilize a total weighted least squares method to calculate an estimated capacity of individual cell groups with Coulomb counting data and state of charge calculations.

Additionally, a method may calculate uncertainty in estimated battery capacity using error propagation, Coulomb counting error, and state of charge error.

Additionally, a method may utilize a comparison between Coulomb counting error estimates and a combined error of a previous capacity estimate and state of charge error to determine whether to anchor points between data sets.

Additionally, a method may utilize a previous battery capacity estimate and state of charge calculation to reset accumulated Coulomb counting error.

Additionally, a method may utilize a weighted average to combine a Coulomb counting value with an expected Coulomb counting value derived from a previous capacity estimate to produce a blended Coulomb counting value that is more accurate than either alone.

Additionally, a method may utilize a total weighted least squares method to calculate the impact of each individual data point on the capacity estimate.

Additionally, one may elect to discard data points based upon the calculated impacts, for example, if the calculated impact of a data point is below a threshold impact value.

While the best modes for carrying out the disclosure have been described in detail, those familiar with the art to which this disclosure relates will recognize various alternative designs and embodiments for practicing the disclosure within the scope of the appended claims.

What is claimed is:

1. A method for battery capacity estimation, comprising:
within a computerized battery capacity estimation controller,
monitoring a sensor operable to gather data regarding a battery;
collecting a plurality of data points based upon the data from the sensor, wherein each of the data points includes a voltage-based state of charge value and a corresponding integrated current value collected contemporaneously to the voltage-based state of charge value;
within the plurality of data points, defining a first data set based upon the data from the sensor being collected during a first time period;
within the plurality of data points, defining a second data set based upon the data from the sensor being collected during a second time period;
determining an integrated current error related to the second data set;
comparing the integrated current error related to the second data set to a threshold integrated current error;
when the integrated current error related to the second data set exceeds the threshold integrated current error, resetting the second data set based upon one of the integrated current values from the first time period;
combining the first data set and the second data set to create a combined data set;
determining a slope of the combined data set as a change in the integrated current versus the voltage-based state of charge;
defining the slope of the combined data set as a voltage slope capacity estimate; and
managing the battery based upon the voltage slope capacity estimate.

2. The method of claim 1, wherein resetting the second data set includes:
determining a direct Coulomb counting error;
determining an estimated Coulomb counting value through propagation of variances;
comparing the direct Coulomb counting error to the estimated Coulomb counting value; and
when the direct Coulomb counting error is greater than the estimated Coulomb counting value, utilizing a Coulomb counting anchor value to correct the second data set.

3. The method of claim 1, wherein resetting the second data set includes:
determining a direct Coulomb counting value for a selected data point from the data set two;
estimating an integrated current value for a selected data point from data set one selected as an anchor point for the selected data point from data set two;
determining a blended integrated current value based upon the direct Coulomb counting value and the estimated integrated current value;
determining a direct Coulomb counting error variance value based upon the direct Coulomb counting value;
determining an integrated current value variance value based upon the estimated integrated current value;
determining a blended integrated current error variance value as a weighted average based upon the direct Coulomb counting error variance value and the integrated current value variance value; and
correcting the second data set based upon the blended integrated current value and the blended integrated current error variance value.

4. The method of claim 1, wherein resetting the second data set when the integrated current error related to the second data set exceeds the threshold integrated current error includes:
determining a variance of integrated current error over increasing battery usage;
determining a variance of voltage-based state of charge;
comparing the variance of integrated current error over increasing battery usage to a value equal to a multiple value times the variance of voltage-based state of charge; and
when the variance of integrated current error over increasing battery usage is greater than the value equal to the multiple value times the variance of voltage-based state of charge, anchoring a data point within the second data set to a data point in the first data set.

5. The method of claim 1, wherein resetting the second data set when the integrated current error related to the second data set exceeds the threshold integrated current error includes:
comparing the voltage-based state of charge values for the second data set to the voltage-based state of charge values for the first data set;
identifying one of the data points from the first data set as an anchor point for the first data set and one of the data points from the second data set as an anchor point for the second data set based upon a difference between the voltage-based state of charge value for the data point from the first data set and the voltage-based state of charge value for the data point from the second data set being less than a threshold;
resetting the anchor point for the second data set based upon the anchor point for the first data set; and
correcting the integrated current values of the second data set based upon the resetting of the anchor point for the second data set.

6. The method of claim 5, wherein resetting the anchor point for the second data set based upon the anchor point for the first data set includes setting the integrated current value for the anchor point for the second data set equal to the integrated current value for the anchor point for the first data set; and
resetting the variance of integrated current error over increasing battery usage to be equal to the variance of voltage-based state of charge.

7. The method of claim 5, wherein resetting the anchor point for the second data set based upon the anchor point for the first data set includes:
referencing a historical value of the voltage slope capacity estimate; and
setting the integrated current value for the anchor point for the second data set based upon the integrated current value for the anchor point for the first data set and the historical value of the voltage slope capacity estimate.

8. The method of claim 5, wherein comparing the integrated current error related to the second data set to the threshold integrated current error includes:
determining an integrated current error variance value for the anchor point for the first data set;
defining the integrated current error variance value for the anchor point for the first data set as a threshold variance value; and
determining an integrated current error variance value for a first data point of the second data set; and
further comprising defining the integrated current error related to the second data set to exceed the threshold integrated current error when the integrated current error variance value for the first data point of the second data set is greater than the threshold variance value.

9. The method of claim 8, further comprising, within the computerized battery capacity estimation controller, iteratively chronologically analyzing and selectively anchoring the plurality of data points of the second data set.

10. The method of claim 1, further comprising, within the computerized battery capacity estimation controller, determining the slope of the combined data set recursively by repeatedly collecting pluralities of the data points and resetting a portion of the data points.

11. The method of claim 10, further comprising, within the computerized battery capacity estimation controller, deleting one of the data points based upon the data point demonstrating a least influence on the slope of the combined data set.

12. The method of claim 1, wherein monitoring the sensor includes:
monitoring a sensor operable to measure battery usage over time;
monitoring a sensor operable to measure battery current;
monitoring a sensor operable to measure battery voltage; and
monitoring a sensor operable to measure battery temperature.

13. The method of claim 1, wherein determining the slope of the combined data set includes applying a weighted total least squares process to the combined data set.

14. A method for battery capacity estimation, comprising:
within a computerized battery capacity estimation controller,
monitoring a sensor operable to gather data regarding a battery;
collecting a plurality of data points based upon the data from the sensor, wherein each of the data points includes a voltage-based state of charge value and a corresponding integrated current value collected contemporaneously to the voltage-based state of charge value;
within the plurality of data points, defining a first data set based upon the data from the sensor being collected during a first time period;
within the plurality of data points, defining a second data set based upon the data from the sensor being collected during a second time period;
determining an integrated current error related to the second data set;
comparing the integrated current error related to the second data set to a threshold integrated current error;
when the integrated current error related to the second data set exceeds the threshold integrated current error, resetting the second data set based upon one of the integrated current values from the first time period, the resetting including:
comparing the voltage-based state of charge values for the second data set to the voltage-based state of charge values for the first data set;
identifying one of the data points from the first data set as an anchor point for the first data set and one of the data points from the second data set as an anchor point for the second data set based upon a difference between the voltage-based state of charge value for the data point from the first data set and the voltage-based state of charge value for the data point from the second data set being less than a threshold;
resetting the anchor point for the second data set based upon the anchor point for the first data set, wherein resetting the anchor point for the second data set based upon the anchor point for the first data set includes:
referencing a historical value of the voltage slope capacity estimate;
setting the integrated current value for the anchor point for the second data set based upon the integrated current value for the anchor point for the first data set and the historical value of the voltage slope capacity estimate; and
correcting the integrated current values of the second data set based upon the resetting of the anchor point for the second data set;
combining the first data set and the second data set to create a combined data set;
determining a slope of the combined data set as a change in integrated current versus voltage-based state of charge;
defining the slope of the combined data set as a voltage slope capacity estimate; and
managing the battery based upon the voltage slope capacity estimate.

15. The method of claim 14, further comprising, within the computerized battery capacity estimation controller, determining the slope of the combined data set recursively by repeatedly collecting pluralities of the data points and resetting a portion of the data points.

16. The method of claim 15, further comprising, within the computerized battery capacity estimation controller, deleting one of the data points based upon the data point demonstrating a least influence on the slope of the combined data set.

17. The method of claim 14, wherein monitoring the sensor includes:
monitoring a sensor operable to measure battery usage over time;
monitoring a sensor operable to measure battery current;
monitoring a sensor operable to measure battery voltage; and
monitoring a sensor operable to measure battery temperature.

18. A system for battery capacity estimation, comprising:
a battery;
a sensor operable to gather information regarding the battery;
a computerized battery capacity estimation controller programmed to:

monitor a sensor operable to gather data regarding a battery;
collect a plurality of data points based upon the data from the sensor, wherein each of the data points includes a voltage-based state of charge value and a corresponding integrated current value collected contemporaneously to the voltage-based state of charge value;
within the plurality of data points, define a first data set based upon the data from the sensor being collected during a first time period;
within the plurality of data points, define a second data set based upon the data from the sensor being collected during a second time period;
determine an integrated current error related to the second data set;
compare the integrated current error related to the second data set to a threshold integrated current error;
when the integrated current error related to the second data set exceeds the threshold integrated current error, reset the second data set based upon one of the integrated current values from the first time period;
combine the first data set and the second data set to create a combined data set;
determine a slope of the combined data set as a change in integrated current versus voltage-based state of charge; and
define the slope of the combined data set as a voltage slope capacity estimate; and
a computerized battery maintenance controller programmed to use the voltage slope capacity estimate to manage the battery.

19. The system of claim 18, further comprising:
a sensor operable to measure battery usage over time;
a sensor operable to measure battery current;
a sensor operable to measure battery voltage; and
a sensor operable to measure battery temperature.

* * * * *